(12) United States Patent
Fort et al.

(10) Patent No.: US 8,031,547 B2
(45) Date of Patent: Oct. 4, 2011

(54) DIFFERENTIAL SENSE AMPLIFIER

(75) Inventors: Jimmy Fort, Aix en Provence (FR);
Renaud Dura, Aix en Provence (FR);
Thierry Soude, Marseilles (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/901,288

(22) Filed: Oct. 8, 2010

(65) Prior Publication Data
US 2011/0026347 A1    Feb. 3, 2011

Related U.S. Application Data

(63) Continuation of application No. 12/169,534, filed on Jul. 8, 2008, now Pat. No. 7,813,201.

(51) Int. Cl.
*G11C 7/02* (2006.01)
*G11C 7/06* (2006.01)
*H03F 3/45* (2006.01)
(52) U.S. Cl. .................. 365/208; 365/189.07; 365/207; 327/52; 327/54; 327/56
(58) Field of Classification Search .................. 365/208
See application file for complete search history.

(56) References Cited

U.S. PATENT DOCUMENTS

| 4,223,394 | A | 9/1980 | Pathak et al. |
|---|---|---|---|
| 4,611,301 | A | 9/1986 | Iwahashi et al. |
| 4,785,259 | A | 11/1988 | Seelbach |
| 4,918,341 | A | 4/1990 | Galbraith et al. |
| 5,013,943 | A | 5/1991 | Hirose |
| 5,023,841 | A | 6/1991 | Akrout et al. |
| 5,162,681 | A | 11/1992 | Lee |
| 5,493,533 | A | 2/1996 | Lambrache |
| 5,585,747 | A | 12/1996 | Proebsting |
| 5,646,900 | A | 7/1997 | Tsukude et al. |
| 5,666,310 | A | 9/1997 | Yu et al. |
| 5,850,359 | A | 12/1998 | Liu |
| 5,886,934 | A | 3/1999 | Nagaoka et al. |
| 5,892,260 | A | 4/1999 | Okumura et al. |
| 5,982,673 | A | 11/1999 | Kiehl |
| 6,049,496 | A | 4/2000 | Forbes et al. |
| 6,091,654 | A | 7/2000 | Forbes et al. |
| 6,094,394 | A | 7/2000 | La Rosa |
| 6,104,066 | A | 8/2000 | Noble et al. |
| 6,235,569 | B1 | 5/2001 | Noble et al. |
| 6,288,575 | B1 | 9/2001 | Forbes |
| 6,349,060 | B1 | 2/2002 | Ogura |

(Continued)

FOREIGN PATENT DOCUMENTS

JP    2001-319488    11/2001

(Continued)

OTHER PUBLICATIONS

Sinha, et al., "High-Performance and Low-Voltage Sense-Amplifier Techniques for sub-90nm SRAM", Sep. 17-20, 2003, SOC Conference, 2003. Proceedings. IEEE International [Systems-on-Chip]. 2003, Amherst, USA, 4 pages.

(Continued)

*Primary Examiner* — Son Mai
(74) *Attorney, Agent, or Firm* — Fish & Richardson P.C.

(57) ABSTRACT

A differential sense amplifier can perform data sensing using a very low supply voltage.

17 Claims, 5 Drawing Sheets

U.S. PATENT DOCUMENTS

| | | |
|---|---|---|
| 6,411,549 B1 | 6/2002 | Pathak et al. |
| 6,451,656 B1 | 9/2002 | Yu |
| 6,466,059 B1 | 10/2002 | Gaibotti et al. |
| 6,473,356 B1 | 10/2002 | Raszka |
| 6,490,212 B1 | 12/2002 | Nguyen et al. |
| 6,583,670 B2 * | 6/2003 | Wang ............... 330/277 |
| 6,608,787 B1 | 8/2003 | Daga et al. |
| 6,707,717 B2 | 3/2004 | Jun-Lin |
| 7,092,278 B2 | 8/2006 | Ishida et al. |
| 7,221,605 B2 | 5/2007 | Forbes |
| 7,272,059 B2 * | 9/2007 | Vimercati et al. ............ 365/203 |
| 7,272,062 B2 | 9/2007 | Taddeo |
| 7,301,370 B1 | 11/2007 | Hanna et al. |
| 7,304,903 B2 | 12/2007 | Mukhopadhyay et al. |
| 7,636,264 B2 | 12/2009 | Fort |
| 7,642,815 B2 | 1/2010 | Fort |
| 7,813,201 B2 | 10/2010 | Fort et al. |
| 7,826,291 B2 * | 11/2010 | Bedarida et al. .............. 365/203 |
| 2006/0072363 A1 | 4/2006 | Tran et al. |
| 2008/0192555 A1 | 8/2008 | Fort |

FOREIGN PATENT DOCUMENTS

WO    WO 2008/100428    8/2008

OTHER PUBLICATIONS

Wang, et al., "A New Current-Mode Sense Amplifier for Low-Voltage Low-Power SRAM Design", Taiwan, 1998, Taiwan, R.O.C., 5 pages.
Hsu, et al., "New Current-Mirror Sense Amplifier Design for High-Speed SRAM Applications", Taiwan, Feb. 2006, Taiwan, R.O.C., 10 pages.
U.S. Appl. No. 11/673,105 Notice of allowance mailed Apr. 3, 2009, 7 pages.
U.S. Appl. No. 11/673,105 Notice of allowance mailed Aug. 5, 2009, 5 pages.
U.S. Appl. No. 11/673,105 Notice of allowance mailed Feb. 6, 2009, 12 pages.
International Application Serial No. PCT/US2008/001696 International Search Report mailed Jun. 16, 2008, 3 pages.
International Application Serial No. PCT/US2008/001696 Written Opinion mailed Jun. 16, 2008, 6 pages.

\* cited by examiner

DIFFERENTIAL SENSE AMPLIFIER

CROSS-REFERENCE TO RELATED APPLICATIONS

This application is a continuation (and claims the benefit of priority under 35 U.S.C. 120) of U.S. application Ser. No. 12/169,534, filed Jul. 8, 2008. The disclosure of the prior application is considered part of (and is incorporated by reference in) the disclosure of this application.

TECHNICAL FIELD

This specification generally relates to data sensing.

BACKGROUND

Sense amplifiers can be used to sense a value of a bit stored in a memory cell of a memory structure. A memory structure can include an array of memory cells. Examples of memory structures include electrically erasable programmable read-only memory (EEPROM), flash memory, and dynamic random access memory (DRAM). Conventional sense amplifiers can be based on differential amplifier architectures. Conventional sense amplifiers compare current from a selected memory cell to current from a reference cell. For example, the reference cell can be a reference memory cell from an array of reference memory cells. As another example, the reference cell can be a dummy bitline, analogous to a standard bitline, with a reference current.

Modern trends show memories using smaller and smaller supply voltages. For example, modern flash memories typically use a 1.2V supply voltage. As memories use less and less power, the difficulty of sensing can increase. To ensure proper sensing, the ratio of the current from a selected memory cell to the current from a reference cell must be high to account for process variations in the memory and reference cells and impacts of memory cycling on the memory cells.

SUMMARY

A differential sense amplifier can perform data sensing using a very low supply voltage (e.g., $VDD \leq 1.2V$).

Particular embodiments of the subject matter described in this specification can be implemented to realize one or more of the following advantages: (i) a differential sense amplifier can be used for very low voltage applications due to a pre-charged bitline close to a supply voltage; (ii) a differential sense amplifier operates at an increased speed due to an amplifier subcircuit and a latch subcircuit; and (iii) a differential sense amplifier operates with increased precision and control of a current trip point due to a differential structure.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Overview

Figure 1:
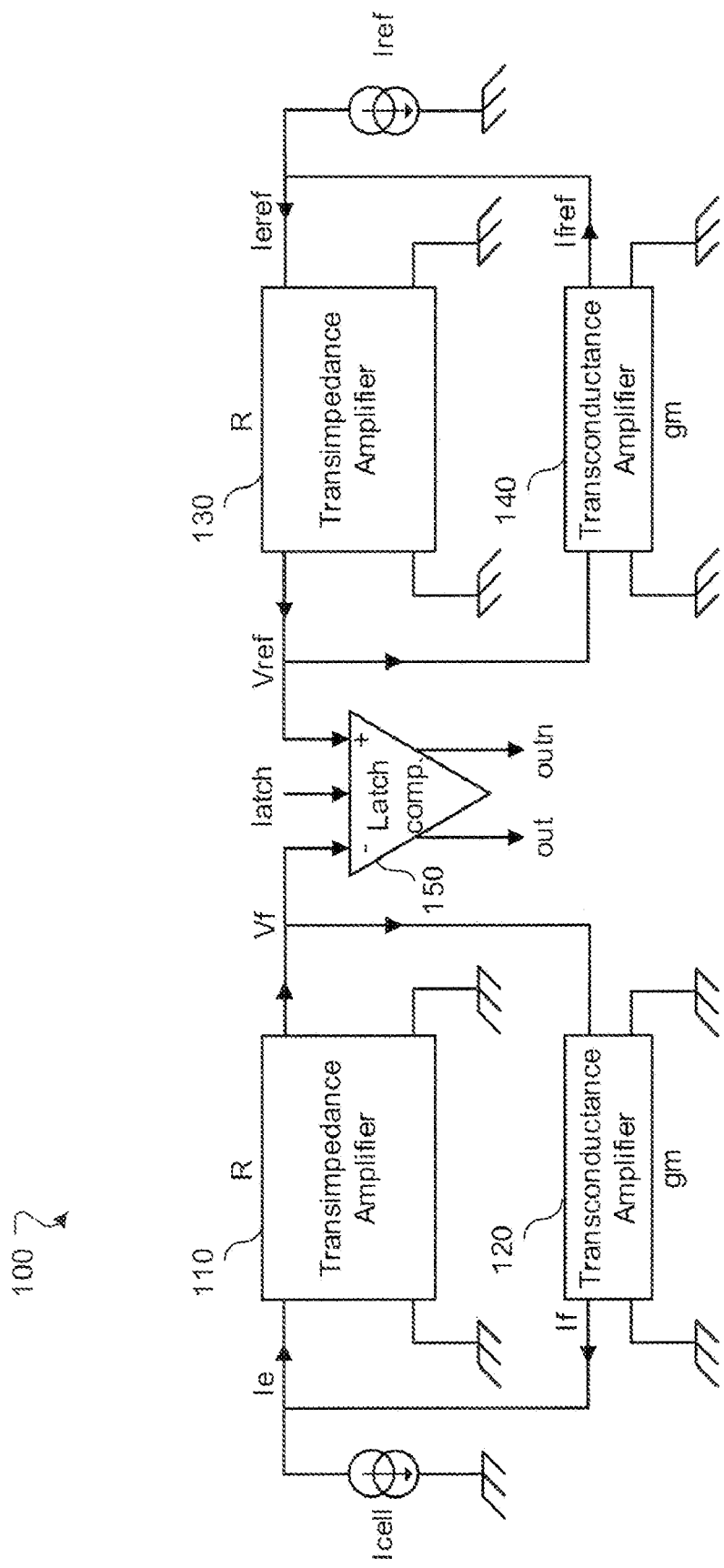
FIG. 1 is a conceptual block diagram of an example differential sense amplifier.

FIG. 1 is a conceptual block diagram of an example differential sense amplifier 100. The differential sense amplifier 100 can have a structure of a transimpedance comparator. The differential sense amplifier 100 can include a first transimpedance amplifier 110, a first transconductance amplifier 120, a second transimpedance amplifier 130, a second transconductance amplifier 140, and a comparator 150 (e.g., a latch comparator).

The differential sense amplifier 100 can be used to sense a current variation from a memory cell (e.g., a current Icell) by comparing the current variation on a bitline to a current variation from a reference cell (e.g., a current Iref), on a reference bitline, for example.

The first transimpedance amplifier 110 can convert a first current variation (e.g., a current Ie) into a first voltage variation (e.g., a voltage Vf). The first transimpedance amplifier 110 can be coupled to a feedback loop that includes the first transconductance amplifier 120. The first transconductance amplifier 120 can convert the first voltage variation into a first feedback current variation (e.g., If) by an equivalent impedance of the first transconductance amplifier 120 (e.g., an equivalent impedance 1/gm). The first feedback current variation can be injected into the bitline to precharge the bitline.

The second transimpedance amplifier 130 can convert a second current variation (e.g., a current Ieref) into a second voltage variation (e.g., a voltage Vref). The second transimpedance amplifier 130 can be coupled to a feedback loop that includes the second transconductance amplifier 140. The second transconductance amplifier 140 can convert the second voltage variation into a second feedback current variation (e.g., Ifref) by an equivalent impedance of the second transconductance amplifier 140 (e.g., an equivalent impedance 1/gm). The second feedback current variation can be injected into the reference bitline.

In summary, a differential input current (e.g., Icell−Iref) can be converted into a differential voltage (e.g., Vf−Vref). The comparator 150 can receive the differential voltage and amplify the differential voltage to produce output voltages (e.g., a voltage out, and a complementary voltage outn).

Figure 2:
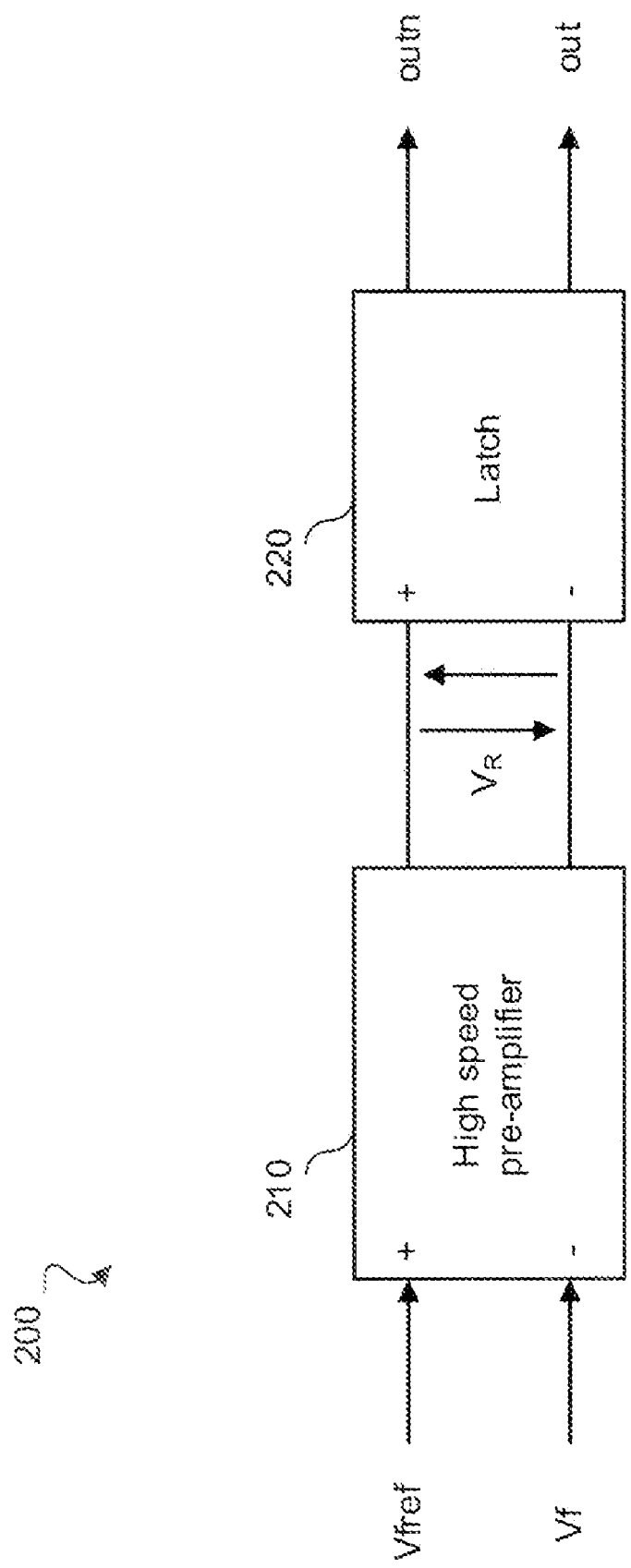
FIG. 2 is a conceptual block diagram of an example comparator.

FIG. 2 is a conceptual block diagram of an example comparator 200 (e.g., the comparator 150 of FIG. 1). The comparator 200 includes an amplifier 210 (e.g., a high speed pre-amplifier) and a latch 220. In some implementations, the amplifier 210 can receive the differential voltage (Vf−Vref) and amplify the differential voltage to produce an amplified output voltage (e.g., Vr). The amplifier 210 can be, for example, a high speed, low offset amplifier with a moderate gain. For example, the gain can be 5, the offset can be 5 mV, and the high speed can be characterized by a bandwidth greater than 100 MHz.

The latch 220 can receive the amplified output voltage and further amplify the voltage to produce the output voltages (out, and complementary outn). In some implementations, the latch 220 can be high speed. For example, the latch 220 can be high speed (e.g., transient response times from 2 to 10 nanoseconds) with a built-in positive feedback. In some implementations, the comparator 220 can have a different architecture.

In some implementations, the comparator 200 can receive the differential voltage (Vf−Vref) without pre-amplification by the amplifier 210. In some implementations, the comparator 200 is a simple comparator without a latch. Other implementations are possible.

Example Circuit

Figure 3:
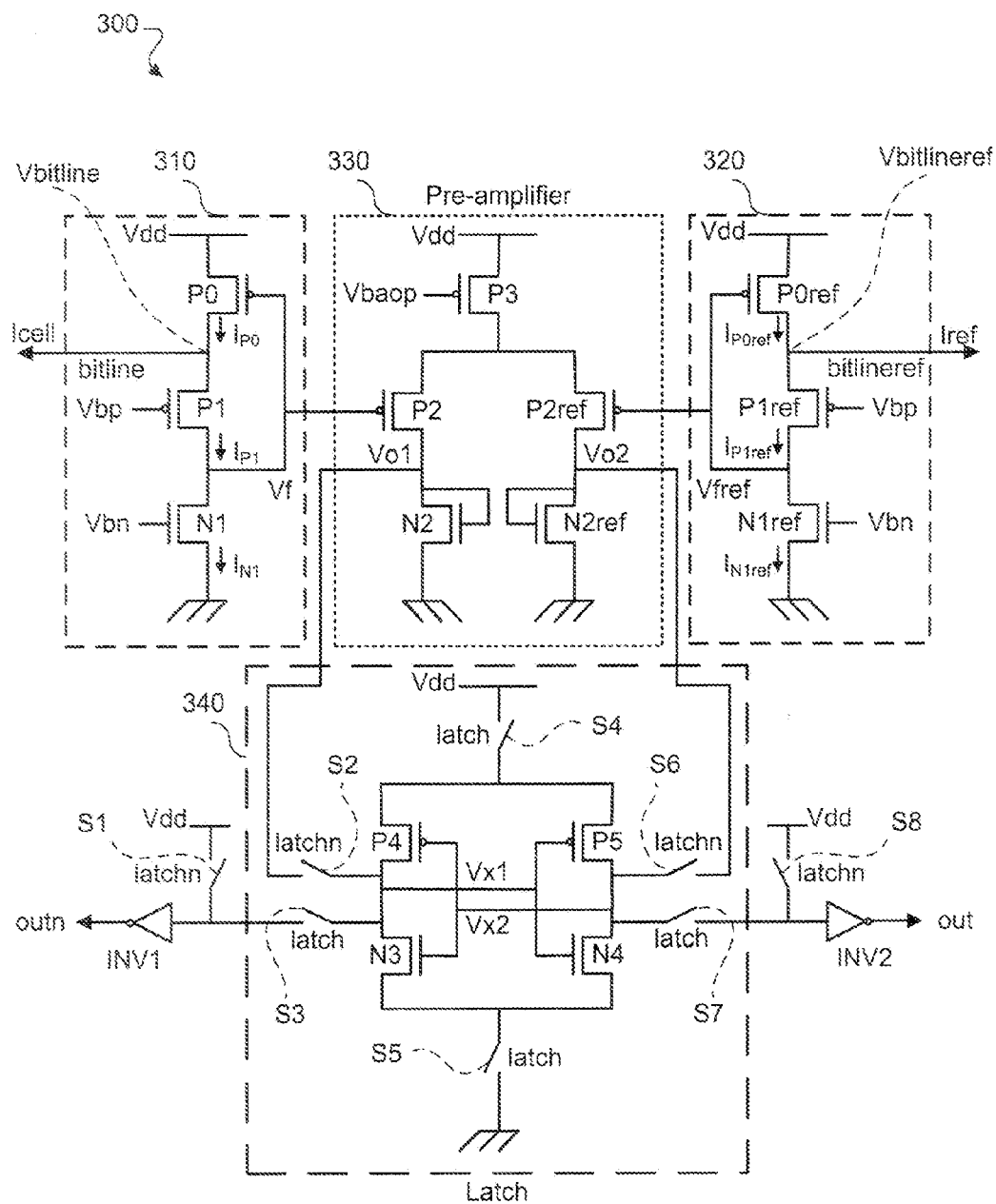
FIG. 3 is a schematic diagram of an example differential sense amplifier circuit.

FIG. 3 is a schematic diagram of an example differential sense amplifier circuit 300 (e.g., the differential sense amplifier 100 of FIG. 1). The differential sense amplifier circuit 300 includes a first transimpedance/transconductance amplifier subcircuit 310 (e.g., the first transimpedance amplifier 110 and the first transconductance amplifier 120 of FIG. 1), a second transimpedance/transconductance amplifier subcircuit 320 (e.g., the second transimpedance amplifier 130 and the second transconductance amplifier 140 of FIG. 1), an amplifier subcircuit 330 (e.g., a pre-amplifier), and a latch subcircuit 340. For example, the comparator 150 of FIG. 1 can include the amplifier subcircuit 330 and the latch subcircuit 340. The differential sense amplifier circuit 300 can precharge a bitline (e.g., bitline of 310, and bitlineref of 320) to a voltage (e.g., Vbitline, and Vbitlineref) that is close to a supply voltage VDD. For example, Vbitline can be precharged to a voltage (VDD−Vdsp$_{P0}$), where Vdsp$_o$ is equal to the saturation drain to source voltage of P0 (e.g., 200 mV). Precharging Vbitline to a value close to VDD provides sufficient current through the bitline for proper current sensing.

The first transimpedance/transconductance amplifier subcircuit 310 includes a first transimpedance amplifier (e.g., the first transimpedance amplifier 110) and a first transconductance amplifier (e.g., the first transconductance amplifier 120). The first transimpedance amplifier includes a p-channel metal-oxide-semiconductor field-effect transistor (pMOSFET) P1 and an n-channel metal-oxide-semiconductor (NMOS) field-effect transistor (nMOSFET) N1. The first transconductance amplifier includes a pMOSFET P0.

The first transimpedance amplifier can be coupled to a bitline (e.g., bitline for a current (cell). The first transimpedance amplifier converts a first current variation (Icell) into a voltage variation (Vf) with a gain equivalent to a resistor rds$_{N1}$.

The first transconductance amplifier can be coupled to the first transimpedance amplifier to provide voltage-current feedback. The first transconductance amplifier converts the voltage variation Vf into a variation of a drain to source current of P0 (I$_{P0}$) with a gain equivalent to the transconductance of P0 (gm$_{P0}$).

The second transimpedance/transconductance amplifier subcircuit 320 includes a second transimpedance amplifier (e.g., the second transimpedance amplifier 130) and a second transconductance amplifier (e.g., the second transconductance amplifier 140). The second transimpedance amplifier includes a pMOSFET P1 ref and a nMOSFET N1 ref. The second transconductance amplifier includes a pMOSFET P0ref.

The second transimpedance amplifier can be coupled to a reference bitline (e.g., bitlineref for a current Iref). The second transimpedance amplifier converts a second current variation (Iref) into a voltage variation (Vfref) with a gain equivalent to a resistor rds$_{N1ref}$.

The second transconductance amplifier can be coupled to the second transimpedance amplifier to provide voltage-current feedback. The second transconductance amplifier converts the voltage variation Vfref into a variation of current I$_{P0ref}$ with a gain equivalent to the transconductance gm$_{P0ref}$.

In some implementations, the first transimpedance/transconductance amplifier subcircuit 310 and the second transimpedance/transconductance amplifier subcircuit 320 can be coupled to the amplifier subcircuit 330. The voltage variations Vf and Vfref are amplified by the gain of the amplifier subcircuit 330. In some implementations, the amplifier subcircuit 330 (e.g., a pre-amplifier) can be coupled to the latch subcircuit 340. The latch subcircuit 340 can be used to determine if a selected memory cell is on or off, as will be described later in the section "Current Sensing". In some implementations, the voltages Vbp, Vbn, and Vbaop are provided by a bias circuit.

Figure 4:
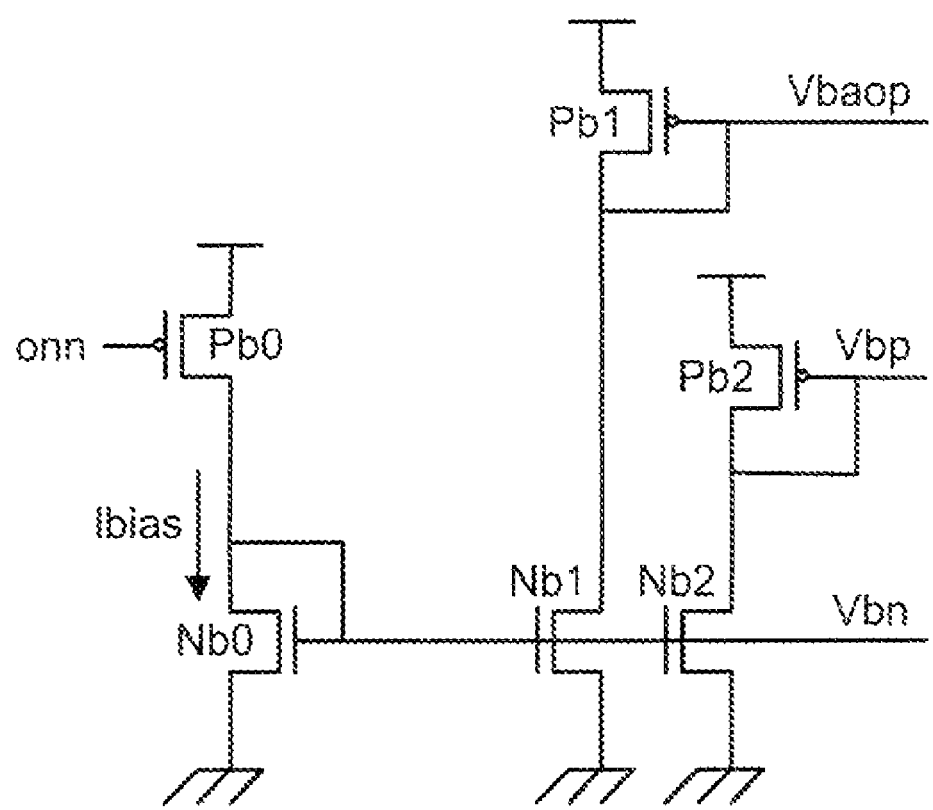
FIG. 4 is a schematic diagram of an example bias circuit.

FIG. 4 is a schematic diagram of an example bias circuit 400. The bias circuit 400 includes pMOSFETs Pb0, Pb1, Pb2. The bias circuit 400 also includes nMOSFETs Nb0, Nb1, and Nb2.

In some implementations, Pb0 and Nb0 can generate a biasing current for the transimpedance/transconductance subcircuits (310 and 320) of the differential sense amplifier 300 and the amplifier subcircuit 330. Pb0 is coupled to a node onn of an external device (e.g., a memory controller). A voltage applied at node onn can enable and disable the differential sense amplifier circuit 300. For example, if the onn node is set to a high voltage (e.g., VDD), then there is no bias current in the differential sense amplifier circuit 300 (e.g., Vo1=Vo2=0V). If onn is set to a low voltage (e.g., substantially close to 0V), then the differential sense amplifier circuit 300 starts precharging at the node bitline (and bitlineref) and current flows through P0 (and P0ref).

Pb0 and Nb0 can generate a bias current, Ibias, if the differential sense amplifier circuit 300 is enabled. Nb0, Nb1, Nb2 form a current mirror for the biasing current Ibias. Pb1 and Nb1 generate the biasing voltage at Vbaop. Pb2 and Nb2 generate the biasing voltage at Vbp.

The differential sense amplifier circuit 300 can also be constructed using other solid state circuit elements or device configurations that take into account fundamental thermal characteristics of voltage or current generation of the electronic components in the bias circuit 400. In some implementations, the bias circuit 400 can include elements or configurations having complementary to absolute temperature (CTAT) characteristics. In some implementations, the bias circuit 400 can include elements or configurations having proportional to absolute temperature (PTAT) characteristics.

Current Sensing

Referring to FIG. 3 and FIG. 4, the bias circuit 400 can generate Ibias for the first transimpedance/transconductance amplifier subcircuit 310 and the second first transimpedance/transconductance amplifier subcircuit 320 by setting the biasing current at N1 and N1 ref, respectively. In particular, the bias circuit 400 can generate the biasing voltage at Vbn using the current mirror for the biasing current Ibias.

The differential sense amplifier circuit 300 can receive electrical power from a supply voltage. In some implementations, the supply voltage, VDD, can be less than 1.5V. In some implementations, the supply voltage can be less than 1.2V. The differential sense amplifier circuit 300 can precharge the bitline (and the reference bitline) to clamped precharge voltages and sense Icell (and Iref) to determine whether a selected memory cell is enabled.

For example, the differential sense amplifier circuit 300 can precharge Vbitline close to VDD (e.g., VDD−Vds$_{P0}$, where Vds$_{P0}$ is drain to source voltage of P0). As an illustrative example, suppose Vbitline is less than the clamped value. If Vbitline=0V, then the first transimpedance/transconductance subcircuit 310 outputs 0V at Vf. In the example, P1 is off if Vbitline=0V, and the voltage at Vf is set to 0V by N1. A precharge current flows through P0 ($I_{P0}$) to precharge a bitline capacitor (not shown). $I_{P0}$ can be directly related to a source to gate voltage of P0 ($Vsg_{P0}$). For example, $I_{P0}$ can be decreased when $Vsg_{P0}$ is decreased. Vbitline increases when $I_{P0}$ flows.

In the example, P1 can be turned on when $Vsg_{P1}$ is greater than a voltage threshold ($Vt_{P1}$). After P1 is turned on, the first transimpedance/transconductance subcircuit 310 can increase the output voltage at Vf. As the voltage at Vf increases, $Vsg_{P0}$ decreases. Thus, the precharge current $I_{P0}$ also decreases. Precharge of the bitline can complete when $I_{P0}=I_{P1}=$Ibias.

If Icell=0, then $I_{P1}$ and $I_{N1}$ can be approximately equal to $I_{P0}$. As discussed above, Nb0, Nb1, Nb2, and N1 are current mirrors of Ibias, so $I_{P1}$ can be approximately equal to Ibias. The clamped Vbitline can depend on factors including a size of P1 and the voltage at Vbp. A maximum Vbitline can be a difference between VDD and the saturated drain-source voltage of P0 ($V_{ds,sat}$).

The reference bitline (bitlineref) of the second transimpedance/transconductance subcircuit 320 can be precharged in a similar manner.

The latch subcircuit 340 can be activated and deactivated by a signal latch and a complementary signal latchn. For example, latch can be a command voltage at switches S3, S4, S5, and S7. As another example, latchn can be a complementary command voltage at switches S1, S2, S6, and S8. In some implementations, the signals latch and latchn can be generated by a delay circuit. In some implementations, the signals latch and latchn can be generated by a dummy bitline. Other implementations are possible.

When the latch subcircuit 340 is not activated (e.g., the latch is off), the latch subcircuit 340 can be biased depending on the state of the selected memory cell (e.g., on or off).

If the memory cell is off (e.g., Icell<Iref), $I_{P0}$ is equal to Ibias. The current flowing through P0ref is (Ibias+Iref). The voltages at Vf and Vfref depend on the sizing of P0 and P0ref, respectively. For example, if the sizing of P0 and P0ref is the same, then Vref<Vfref. The difference between Vref and Vfref can be amplified by the amplifier subcircuit 330. Because Vo1 equals Vx1 and Vo2 equals Vx2 in this example, the amplifier subcircuit 330 generates a negative differential voltage at the input of the latch subcircuit 340 (e.g., Vx1-Vx2).

If the memory cell is on (e.g., Icell>Iref), $I_{P0}$ is equal to (Ibias+Icell) due to the negative voltage-current feedback, and Vbitline is maintained (e.g., substantially constant). Vf decreases to become less than Vfref. The difference between Vref and Vfref can be amplified by the amplifier subcircuit 330. The amplifier subcircuit 330 generates a positive differential voltage at the input of the latch subcircuit 340 (e.g., Vx1-Vx2).

When the latch subcircuit 340 is activated (e.g., the latch is on), a differential voltage (Vx1-Vx2) can be amplified by positive feedback in the latch subcircuit 340. (Vx1-Vx2) can be positive or negative depending on the state of the selected memory cell. The output out can be set to 0 if a selected memory cell is off. The output out can be set to VDD if the selected memory cell is on.

In summary, the differential sense amplifier 300 can be turned off by setting onn in the bias circuit 400 high and latchn in the latch subcircuit 340 low. Accordingly, the switches (e.g., S7, S8) and inverter (e.g., INV2) in the latch subcircuit 340 set the output low. Alternatively, the differential sense amplifier 300 can be turned on by setting onn in the bias circuit 400 low. When the differential sense amplifier 300 is on, bitline and bitlineref can be precharged by $I_{P0}$ and $I_{P0ref}$, respectively.

Figure 5:
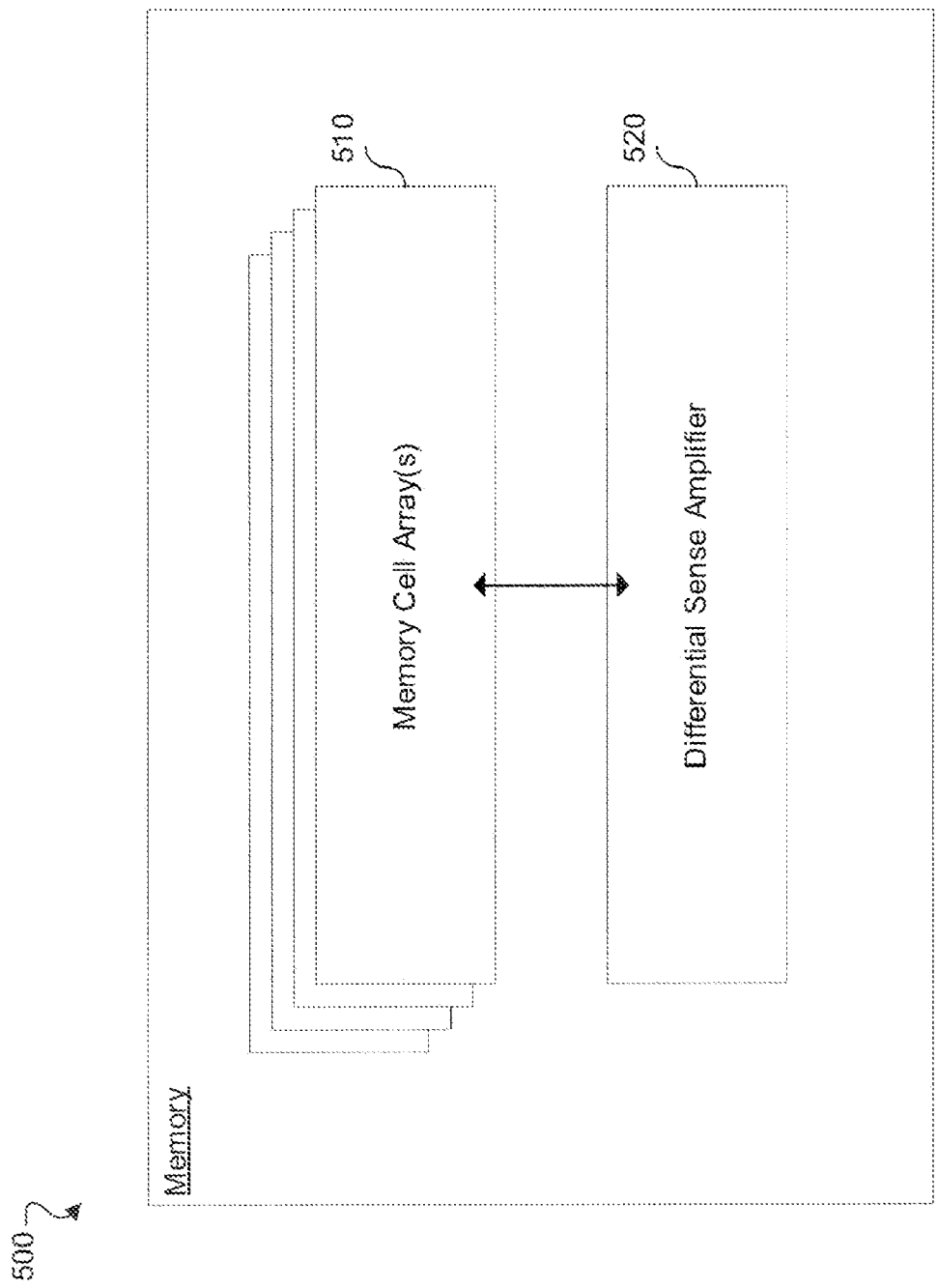
FIG. 5 is a conceptual block diagram of an example memory.

When the selected memory cell is off (e.g., '0' is stored in a selected memory cell of a memory cell array 510 of FIG. 5), $I_{P0}$ is equal to Ibias, and $I_{P0ref}$ is equal to (Ibias+Iref). Therefore, Vf>Vfref and Vo1<<Vo2. When the latch subcircuit 340 is activated, Vx1 goes low and Vx2 goes high, so the output out is set at 0V to indicate that the selected memory cell is off.

When a selected memory cell is on (e.g., '1' is stored in a selected memory cell of a memory cell array 510 of FIG. 5), $I_{P0}$ is equal to (Ibias+Icell), and $I_{P0ref}$ is equal to (Ibias+Iref). Therefore, Vf<Vfref and Vo1>>Vo2. When the latch subcircuit 340 is activated, Vx1 goes high and Vx2 goes low, so the output out is set to VDD to indicate that the selected memory cell is on.

Modeling

Sizing of the elements of the differential sense amplifier 300 can be determined by calculating a bitline precharge value (e.g., Vbitline) for target performance characteristics. The target performance characteristics can include, but are not limited to, a target current trip point, access time, and power usage.

In some implementations, the clamped Vbitline can be related to a polarization of a loop formed by P1, N1, and P0. For example, $I_{P0}$ stops when $I_{P0}=I_{P1}=$Ibias. $I_{P0}=I_{P1}=$Ibias occurs when P0, P1, and N1 are in saturation region. For example, $$I_{P1} = Ibias = \frac{K_p}{2} \left. \left| \frac{W}{L} \right| \right|_{P1} (V_{bitline} - Vbp - |Vt_{P1}|)^2;$$

where $K_p$ is a p-type device manufacturing process gain factor, W is a width, and L is the length of the device P1. By solving the above equation, the clamped Vbitline can be expressed as:

$$V_{bitline} = \sqrt{\frac{2 \cdot Ibias}{K_p \cdot \left. \left| \frac{W}{L} \right| \right|_{P1}}} + Vbp + |Vt_{P1}|.$$

In the example, Ibias and Vbp are maintained by the bias circuit 400. In some implementations, P0 operates at saturation when the precharge operation stops. Such a condition can be described by the expressions:

$$V_{bitline} = VDD - |Vds_{sat}|_{P0}, \text{ and}$$

$$VDD - V_{bitline} \geq VDD - Vf - |Vt_{P0}|.$$

By solving the above equations for Vbitline, a relationship between Vbitline, Vf and $Vt_{P0}$ can be expressed as:

$$V_{bitline} \leq Vf + |Vt_{P0}|, \text{ where } Vf = VDD - \sqrt{\frac{2 \cdot Ibias}{K_p \cdot \left. \left| \frac{W}{L} \right| \right|_{P0}}} + |Vt_{P0}|.$$

As shown in the above equations, the clamped precharge voltage Vbitline depends on a size of P1, Ibias, and the voltage Vbp. The clamped precharge voltage can be produced at a voltage level within one transistor voltage drop of the supply voltage VDD. For example, the differential sense amplifier circuit 300 can precharge Vbitline to a voltage close to (VDD−100 mV).

Because the clamped Vbitline is close to VDD, the differential sense amplifier circuit 300 can be used in low supply voltage (e.g., low VDD) applications. Current sensing depends on the ratio of Icell to Iref. Icell depends on the clamped Vbitline. As the clamped Vbitline increases to a value close to VDD, Icell also increases, making it easier to sense Icell. In low supply voltage applications, if the clamped Vbitline is not close to VDD, Icell can be decreased, increasing the difficulty of sensing Icell. In addition, as Icell decreases, the current sensing can become more susceptible to noise, for example.

A voltage variation can be created at Vf that is a function of Icell, while maintaining a substantially constant Vbitline. The voltage variation at Vf can be expressed as:

$$Vf = \frac{rds_{N1}}{1 + gm_{P0} \cdot rds_{N1}} \cdot Icell;$$

where the resistor $rds_{N1}$ represents the gain of the transimpedance amplifier (P1 and N1), and $gm_{P0}$ represents the gain of the transconductance amplifier (P0).

If $gm_{P0} \cdot rds_{N1} \gg 1$, then Vf can be expressed as:

$$Vf \approx 1/gm_{P0} \cdot Icell.$$

Thus, an $I_{P0}$ variation can be expressed as:

$$i_{P0} = gm_{P0} \cdot Vf = Icell.$$

Therefore, Vbitline is maintained by the voltage variation at Vf.

The trip point of the differential sense amplifier 300 depends on the reference current (Iref). For example, Iref can be fixed by a reference memory cell, where $Icell_{th} = Iref$.

Before the latch subcircuit 340 is activated, the differential gain of the amplifier subcircuit 330 can be represented by the expression:

$$Vo1 - Vo2 = A(Vfref - Vf) = \frac{gm_{P2}}{gm_{N2}}(Vfref - Vf);$$

where A is the gain of the amplifier subcircuit 330, $gm_{P2}$ is the transconductance of P2, and $gm_{N2}$ is the transconductance of N2. Although the gain of the amplifier subcircuit 330 can be small, the amplifier subcircuit 330 can have a high bandwidth. For example, A can be less than 10, and the bandwidth can be greater than 100 MHz.

The second transimpedance/transconductance amplifier subcircuit 320 operates in a similar manner.

The differential gain of the latch subcircuit 340 (e.g., a discrete time comparator) can be represented by the expression:

$$vout(t) = (Vx1 - Vx2)(t) = (Vo1 - Vo2) \cdot e^{\frac{gm \cdot t}{C}};$$

where C is a capacitance and gm is a transconductance.

The gain can be high and the transient response can be very fast because the latch subcircuit 340 receives a differential voltage (Vo1−Vo2) at the input of the latch subcircuit 340 before the latch subcircuit 340 has been activated. For example, the gain of the latch subcircuit 340 can be about 1000 (or 60 decibels) due to positive feedback. As another example, transient response times (e.g., exponential response times) can range from 2 to 10 nanoseconds depending on the size of the transistors (e.g., N3, N4, P4, and P5). The transient response times can be fast due to a small capacitance (e.g., C<1 picofarad) and a high transconductance (e.g., 100 to 200 microsiemens) of the latch subcircuit 340.

Applications

FIG. 5 is a conceptual block diagram of an example memory 500. The memory 500 can include one or more memory cell arrays 510 and a differential sense amplifier 520 (e.g., the differential sense amplifier 100, 300, etc.). The differential sense amplifier 520 can be used to sense bit values in one or more memory cells in the one or more memory cell arrays 510. The memory 500 can be a computer readable medium such as volatile or non-volatile that stores information. For example, the memory is capable of storing instructions to be processed by a processor of a computer. A computer can be embedded in another device, e.g., a mobile telephone, a personal digital assistant (PDA), a mobile audio or video player, a game console, a Global Positioning System (GPS) receiver, to name just a few.

A number of implementations of the invention have been described. Nevertheless, it will be understood that various modifications may be made without departing from the spirit and scope of the invention. Accordingly, other implementations are within the scope of the following claims.

What is claimed is:

1. A memory comprising:
   one or more memory cells; and
   a differential sense amplifier that includes:
   a first sense amplifier operable to precharge a first bitline, wherein the first sense amplifier includes a first transimpedance amplifier and a first transconductance amplifier coupled to the first transimpedance amplifier;
   a second sense amplifier operable to precharge a second bitline, wherein the second sense amplifier includes a second transimpedance amplifier and a second transconductance amplifier coupled to the second transimpedance amplifier;
   and a comparator coupled to the first sense amplifier and the second sense amplifier and operable to amplify a differential voltage, wherein the differential voltage is a difference between a first voltage variation generated by the first sense amplifier and a second voltage variation generated by the second sense amplifier.

2. The memory of claim 1, wherein the comparator includes a pre amplifier coupled to the first sense amplifier and the second sense amplifier and operable to amplify the differential voltage.

3. The memory of claim 1, wherein the comparator includes a latch operable to indicate a state of a selected memory cell.

4. The memory of claim 1, wherein the one or more memory cells are arranged in one or more memory cell arrays.

5. The memory of claim 1, wherein the one or more memory cells are selectively coupled to the first bitline.

6. The memory of claim 1, wherein:
   the first transimpedance amplifier is operable to convert a current variation into the first voltage variation; and the first transconductance amplifier is operable to convert the first voltage variation into a first feedback current variation and inject the first feedback current variation into the first bitline.

7. The memory of claim 1, wherein the second bitline is a reference bitline, and wherein:
the second transimpedance amplifier is operable to convert a current variation into the second voltage variation; and
the second transconductance amplifier is operable to convert the second voltage variation into a second feedback current variation and inject the second feedback current variation into the reference bitline.

8. The memory of claim 1, wherein the first sense amplifier and the second sense amplifier are coupled to a bias subcircuit.

9. The memory of claim 1, wherein the first voltage variation generated by the first sense amplifier is based on a state of a first memory cell coupled to the first bitline.

10. The memory of claim 1, wherein the second voltage variation generated by the second sense amplifier is based on a state of a reference cell coupled to the second bitline.

11. The memory of claim 1, wherein the first sense amplifier is operable to precharge the first bitline to a bitline voltage substantially equal to the supply voltage minus a drain to source voltage of a single transistor of the first sense amplifier.

12. The memory of claim 1, wherein the second sense amplifier is operable to precharge the second bitline to a bitline voltage substantially equal to the supply voltage minus a drain to source voltage of a single transistor of the second sense amplifier.

13. A differential sense amplifier comprising:
a first sense amplifier comprising:
  a first transimpedance amplifier operable to convert a first current variation into a first voltage variation; and
  a first transconductance amplifier coupled to the first transimpedance amplifier and operable to convert the first voltage variation into a first feedback current variation and inject the first feedback variation into a bitline; and
a second sense amplifier operable to convert a second current variation based on a reference bitline into a second voltage variation, wherein the second sense amplifier includes a second transimpedance amplifier and a second transconductance amplifier coupled to the second transimpedance amplifier; and
a comparator coupled to the first sense amplifier and the second sense amplifier and operable to amplify a differential voltage variation, wherein the differential voltage variation is a difference between the first voltage variation and the second voltage variation.

14. The differential sense amplifier of claim 13, wherein the first sense amplifier and the second sense amplifier are coupled to a bias subcircuit.

15. The differential sense amplifier of claim 13, wherein the comparator includes a pre-amplifier coupled to the first sense amplifier and the second sense amplifier and operable to amplify the differential voltage variation.

16. The differential sense amplifier of claim 13, wherein the comparator includes a latch.

17. The differential sense amplifier of claim 13, wherein the first current variation represents a state of a memory cell, and the second current variation represents a state of a reference cell.

* * * * *

UNITED STATES PATENT AND TRADEMARK OFFICE
CERTIFICATE OF CORRECTION

PATENT NO. : 8,031,547 B2  Page 1 of 1
APPLICATION NO. : 12/901288
DATED : October 4, 2011
INVENTOR(S) : Jimmy Fort, Renaud Dura and Thierry Soude It is certified that error appears in the above-identified patent and that said Letters Patent is hereby corrected as shown below:

Column 3, line 28, delete "$Vdsp_{P0}$)," and insert --$Vds_{P0}$),--.

Column 3, line 28, delete "$Vdsp_o$" and insert --$Vds_{P0}$--.

Column 3, line 42, delete "(cell)." and insert --Icell).--.

Column 3, line 57, delete "P1 ref" and insert --P1ref--.

Column 3, line 57, delete "N1 ref." and insert --N1ref.--.

Column 4, line 54, delete "N1 ref," and insert --N1ref,--.

Column 5, line 40, delete "P0ref" and insert --P0ref--.

Column 7, line 34, delete "$i_{P0}$" and insert --$I_{P0}$--.

Column 7, line 54, delete "amplifer" and insert --amplifier--.

Column 8, line 55, in claim 2, delete "pre amplifier" and insert --pre-amplifier--.

Signed and Sealed this
Twenty-ninth Day of November, 2011

David J. Kappos
*Director of the United States Patent and Trademark Office*